United States Patent
Tsai et al.

(10) Patent No.: US 10,477,722 B2
(45) Date of Patent: Nov. 12, 2019

(54) SOCKET COVERS WITH AIR IMPEDING STRUCTURES

(71) Applicant: HEWLETT PACKARD ENTERPRISE DEVELOPMENT LP, Houston, TX (US)

(72) Inventors: Pinche Tsai, Houston, TX (US); James Jeffery Schulze, Houston, TX (US); Kapil Rao Ganta Papa Rao Bala, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 307 days.

(21) Appl. No.: 15/267,820

(22) Filed: Sep. 16, 2016

(65) Prior Publication Data

US 2018/0084669 A1   Mar. 22, 2018

(51) Int. Cl.
*H05K 7/20* (2006.01)

(52) U.S. Cl.
CPC ..... *H05K 7/20145* (2013.01); *H05K 7/20727* (2013.01)

(58) Field of Classification Search
None
See application file for complete search history.

(56) References Cited

U.S. PATENT DOCUMENTS

| 5,856,910 | A | 1/1999 | Yurchenco et al. |
| 7,403,383 | B2 * | 7/2008 | McGuff ................ G06F 1/20 165/121 |
| 7,474,528 | B1 * | 1/2009 | Olesiewicz ........ H05K 7/20154 361/694 |
| 7,876,559 | B2 | 1/2011 | Shabbir et al. |
| 8,102,651 | B2 * | 1/2012 | Bland ................ G06F 1/20 361/694 |
| 8,675,365 | B2 * | 3/2014 | Pav ................ G06F 1/206 165/122 |
| 2006/0024982 | A1 * | 2/2006 | Stone ................ H05K 7/1053 439/41 |

* cited by examiner

*Primary Examiner* — Dimary S Lopez Cruz
(74) *Attorney, Agent, or Firm* — Hewlett Packard Enterprise Patent Department

(57) ABSTRACT

Examples described herein include socket covers with air impeding structures. In some examples, a processing unit socket cover comprises a base, an air impeding structure, and an engagement latch. The base may have a surface facing away from the socket and a perimeter defined by the surface. The air impeding structure may protrude from the surface and extend from a first side of the perimeter to a second side of the perimeter, diving the surface. The engagement latch may be connected to the air impeding structure to attach to the socket.

9 Claims, 11 Drawing Sheets

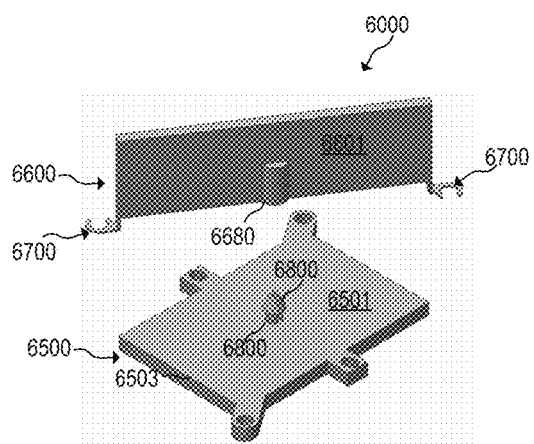 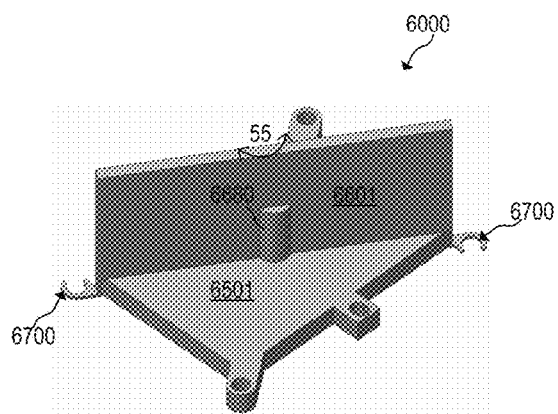
FIG. 14  FIG. 15
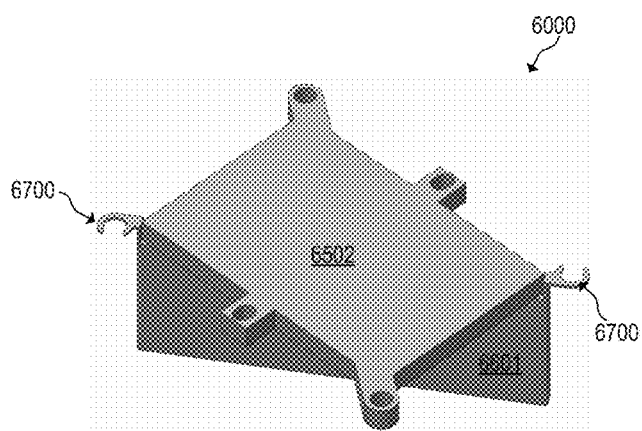
FIG. 16

SOCKET COVERS WITH AIR IMPEDING STRUCTURES

BACKGROUND

A computing device may have sockets for the attachment of processing units, such as a central processing unit. In some examples, a computing device may be underpopulated, in which at least one socket is not populated with a processing unit.

BRIEF DESCRIPTION OF THE DRAWINGS

The following detailed description references the drawings, wherein:

FIG. 14 illustrates a top perspective view a socket cover with an attachable air impeding structure, according to some examples.

FIG. 15 illustrates the socket cover of FIG. 14 with the air impeding structure attached to the socket cover, according to some examples.

FIG. 16 illustrates a bottom perspective view of the socket cover of FIG. 14, according to some examples.

DETAILED DESCRIPTION

Figure 1:
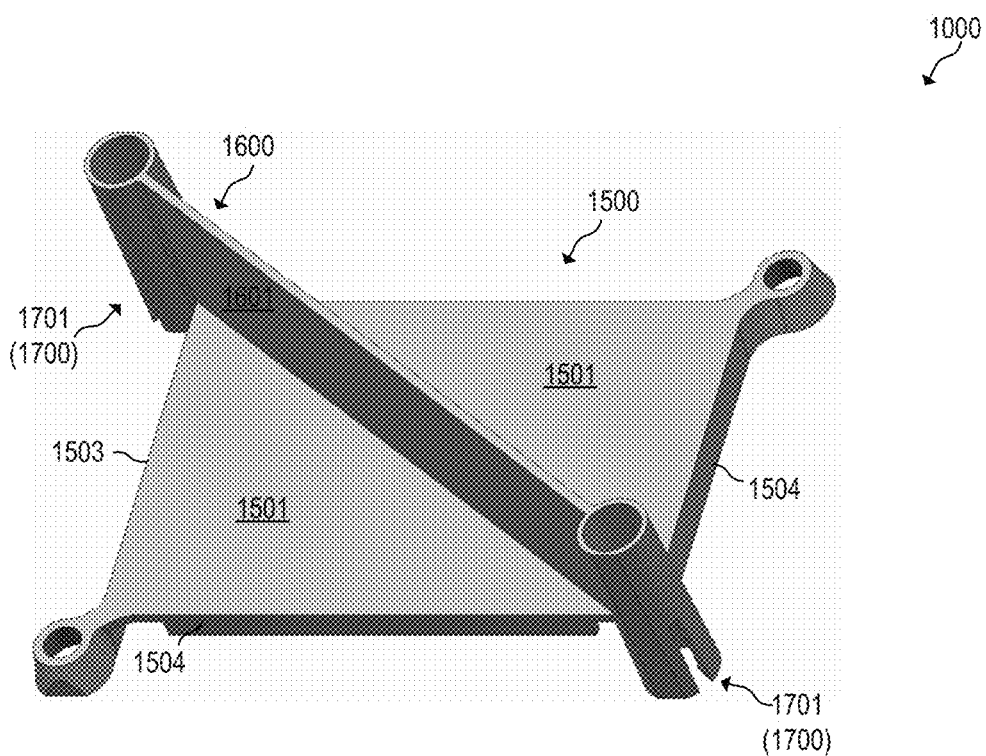
FIG. 1 illustrates a top perspective view of a socket cover with an air impeding structure, according to some examples.

A computing device that may accommodate a specific number of processing units may come populated with less than the specific number of processing units. For example, a computing device may offer sockets for three or more processing units but may come populated with one or two processing units. In these situations, the computing device has at least one unpopulated socket.

Unpopulated sockets (i.e. sockets without attached processing units) may require protection until they are ready to be populated with a processing unit. Additionally, unpopulated sockets may affect the heat dissipation of the computing device. For example, the computing device and associated cooling systems may be designed for optimal operation while fully populated. If a processing unit socket is unpopulated, the air flow through that area of the computing device may increase due to the lack of air flow impedance that would be provided by the processing unit.

In some examples, an unpopulated processing unit socket may be protected by a cover that sits on top of an unpopulated processing unit. The cover may provide protection of the socket from physical damage that may result during shipment of the computing device. The cover may also prevent dust from collecting on the socket pins. Additionally, in some examples, a processing unit blank may sit on top of the cover. The processing unit blank is a separate piece of plastic that may attach to the cover to create air flow impedance that would be normally be provided by the processing unit.

The point of attachments of the cover are generally located at the corners of the cover. In some situations, the cover has a slim profile, providing it with a lot of flex. Due to the flex and the corner attachment points of the cover, an installment or removal of the cover may lead to pin damage to the underlying processing unit socket. Additionally, the use of both the cover and the separate blank may lead to increased damage to the underlying processing unit socket as two pieces need to be installed and removed from the processing unit socket.

Examples disclosed herein address these technical challenges by providing a processing unit socket cover with an air impeding structure. The air impeding structure protrudes from the cover, extending across the cover to act as a baffle to create air flow impedance. The air impeding structure is operatively connected to at least one engagement latch that allows the cover to attach to the underlying processing unit socket. The connection of the air impeding structure to the engagement latch allows the socket cover to be attached to the underlying processing unit socket via a force application on the air impeding structure. Thus, in examples disclosed herein, the location of the installation and removal force application is moved towards the middle of the cover and away from the pins. Additionally, examples disclosed herein allow for one structure that provides both a protective cover to the processing unit socket and a baffle to create air flow impedance. These features may cause less pin damage to the underlying processing unit socket when the socket cover is being installed and removed.

In some examples, a processing unit socket cover comprises a base, an air impeding structure, and an engagement latch. The base has a surface facing away from the socket and a perimeter defined by the surface. The air impeding structure protrudes from the surface and extends from a first side of the perimeter to a second side of the perimeter, dividing the first surface. The engagement latch is connected to the air impeding structure to attach to the socket.

In some examples, a processing unit socket cover comprises a rectangular base with a surface, an air impeding structure, and an annular snap-on lock. The air impeding structure protrudes from the surface and extends across the surface. The annular snap-on lock is operatively coupled to the air impeding structure to attach to the socket.

In some examples, a processing unit socket cover comprises a base, an air impeding structure, and a plurality of connection points. The base has a surface and a perimeter that is defined by the surface. The air impeding structure protrudes from the surface and extends from a first side of the perimeter to a second of the perimeter, bisecting the surface. At least one connection point out of the plurality of connection points comprises a snap-on lock to attach to the socket.

Figure 2:
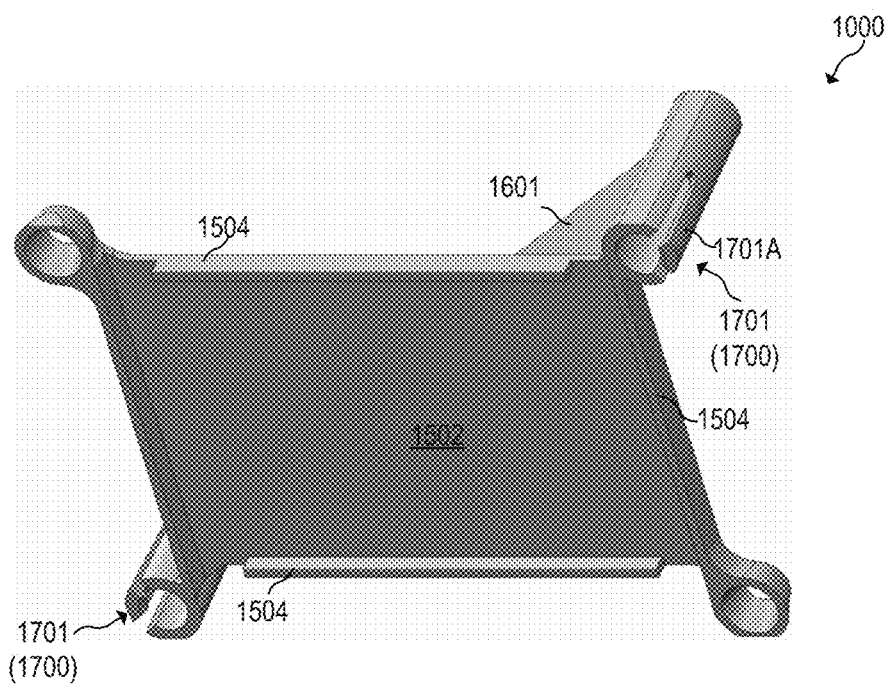
FIG. 2 illustrates a bottom perspective view of the socket cover of FIG. 1, according to some examples.

Referring now to the figures, FIG. 1 illustrates a top perspective view of a socket cover 1000 and FIG. 2 illustrates a back perspective view of socket cover 1000. In some examples, socket cover may be a processing unit socket cover. As used herein, a processing unit may, for example, be in the form of a central processing unit (CPU), a semiconductor-based microprocessor, a digital signal processor (DSP) such as a digital image processing unit, other hardware devices or processing elements suitable to retrieve and execute instructions stored in a storage medium, or suitable combinations thereof. A processing unit socket may act to lock the processing unit (e.g., a central processing unit) to the board of the computing device such that data can be transferred to the processing unit. A processing unit socket may be based on a pin grid array (PGA) architecture.

Socket cover 1000 comprises a base 1500, an air impeding structure 1600, and an engagement latch 1700. In some examples, and as will be described later, air impeding structure 1600 is connected to engagement latch 1700 such that an application of force on the air impeding structure may operate the engagement latch 1700.

In some examples, base 1500 has a surface 1501 that faces away from a socket when socket cover 1000 is installed on the socket. Surface 1501 may define a perimeter 1503. As used herein, a perimeter may include a continuous line that forms an outer boundary of base 1500. In some examples, and as shown in FIGS. 1-2, base 1500 may have a rectangular shape. Accordingly, perimeter 1503 may also have a rectangular shape. In other examples, base 1500 and perimeter 1503 may have other shapes, such as square, circular, or oval shapes, etc. Air impeding structure 1600 protrudes from surface 1501. In some examples, and as shown in FIGS. 1-2, air impeding structure 1600 is connected to base 1500 in a manner that it cannot be detached from base 1500 without breaking or fragmenting socket cover 1000. For example, base 1500 and air impeding structure 1600 may be integrally molded to form one piece of continuous material. In other examples, base and air impeding structure may be attachable to each other. This is discussed, for example, in relation to FIGS. 14, 15, and 16.

Figure 5:
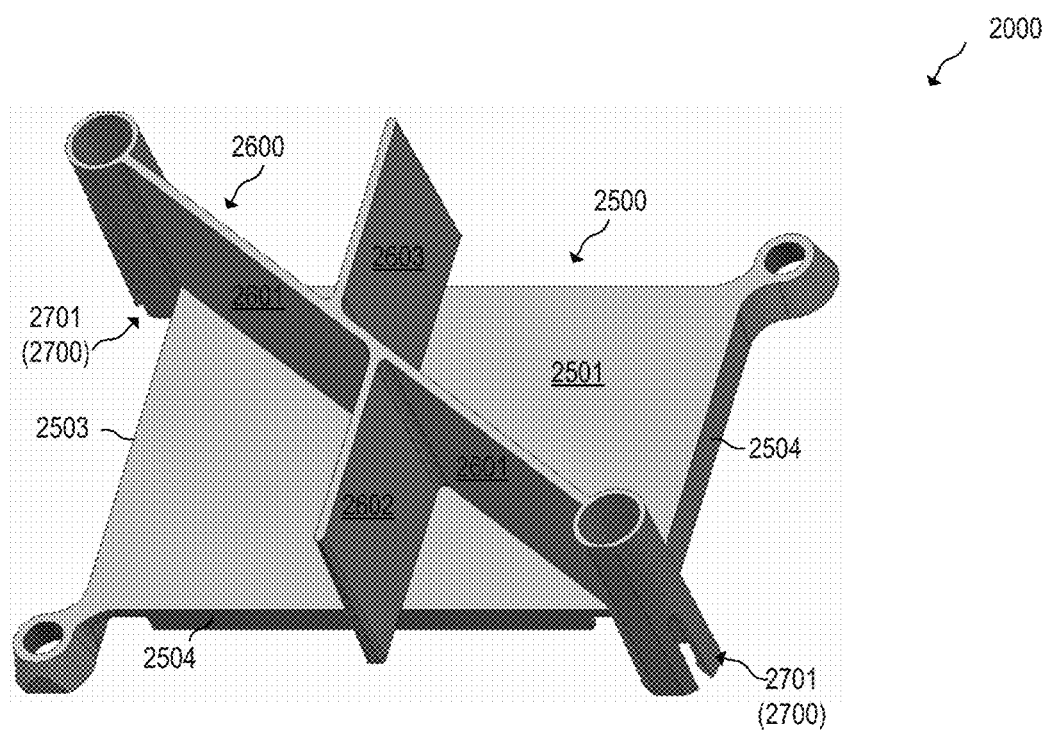
FIG. 5 illustrates a top perspective view of a socket cover with an air impeding structure, according to some examples.
Figure 6:
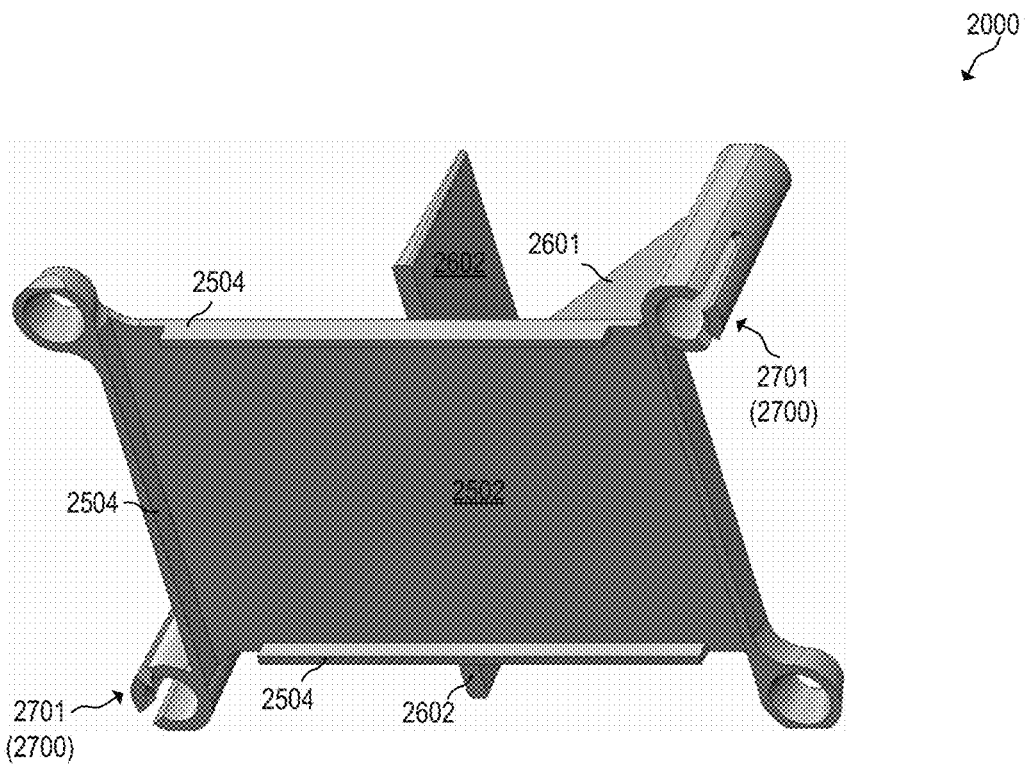
FIG. 6 illustrates a bottom perspective view of the socket cover of FIG. 5, according to some examples.
Figure 19:
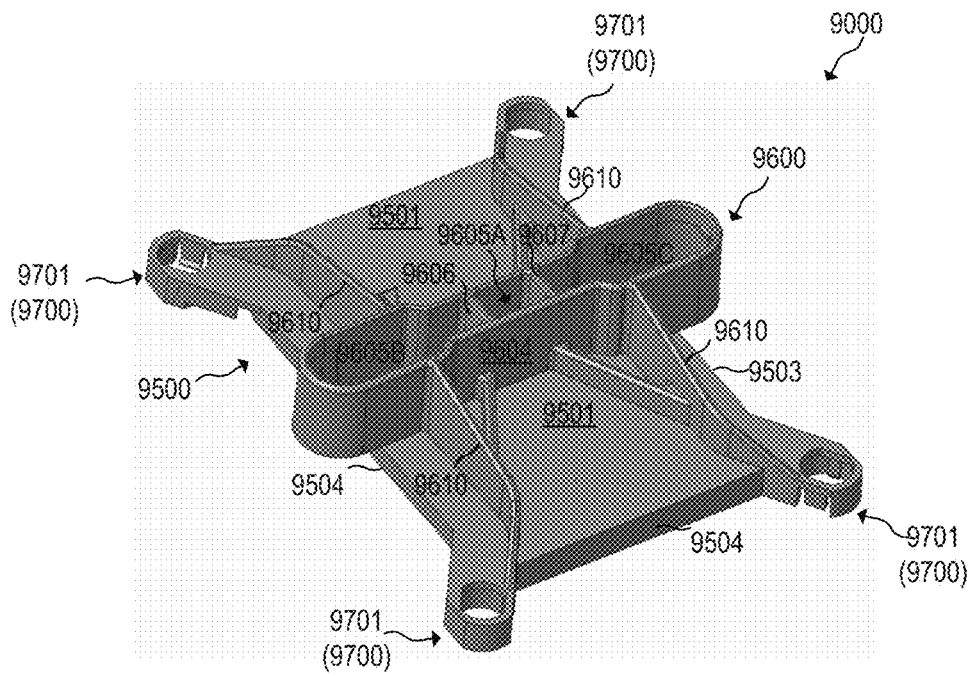
FIG. 19 illustrates a top perspective view of a socket cover with an air impeding structure, according to some examples.
Figure 20:
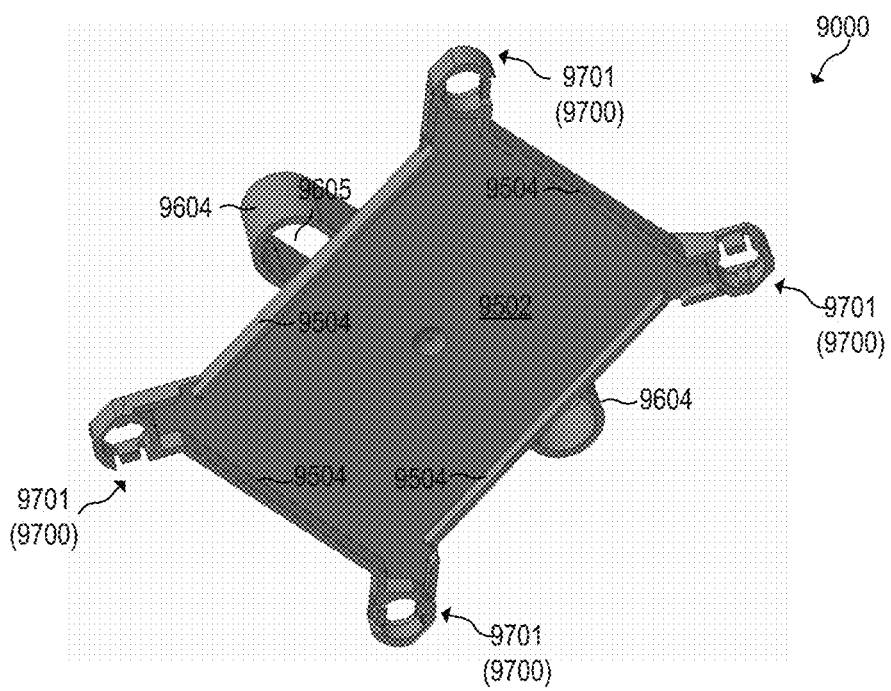
FIG. 20 illustrates a bottom perspective view of the socket cover of FIG. 19, according to some examples.
Figure 21:
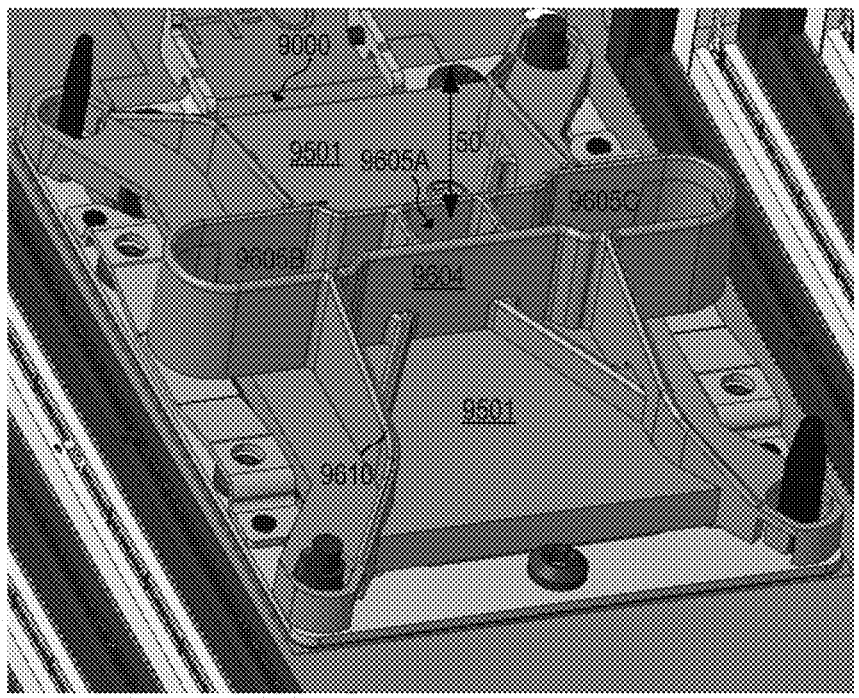
FIG. 21 illustrates the socket cover of FIG. 19 installed on a socket, according to some examples.

In some examples, air impeding structure 1600 comprises a first wall 1601 that extends across surface 1501. First wall 1601 (and thus air impeding structure 1600) may extend across surface 1501 horizontally, vertically, or diagonally. For example, as shown in FIGS. 1 & 2, wall 1601 extends across surface 1501 diagonally. As another example, and as shown in FIGS. 19-21, an air impeding structure may extend across surface horizontally. As yet another example, air impeding structure 1600 may extend across surface 1501 in multiple directions. For example, as shown in FIGS. 5 & 6, air impeding structure 2600 comprises a first wall 2601 that extends across surface 2501 diagonally and a second wall 2602 and a third wall 2603 that extends across surface 2501 vertically. In some examples, and as shown in FIGS. 1 & 2, air impeding structure 1600 extends across surface 1501 from one side of perimeter 1503 to another side of perimeter 1503. This allows air impeding structure 1600 to impede air currents that may flow over cover 1600 by providing a continuous blockage of an airflow pathway across surface 1501.

In some examples, air impeding structure 1600 has a height that may be measured upwards from surface 1501. The height may be significant as to create an occlusion that interrupts airflow across surface 1501 of base 1500. In some examples, first wall 1601 may have a height that is driven by the heights of other components that may be present on a motherboard that an underlying socket is attached to. For example, wall 1601 may have a height that is equal to the tallest component present on the motherboard. As another example, wall 1601 may have a height that is equal to a height of a standard dual in-in line memory module (DIMM) or a DIMM latch. In some examples, the height of wall 1601 may be driven by other factors in addition to or instead of the other components on the motherboard, such as bulk packaging considerations.

A portion of air impeding structure 1600 may be located a distance away from perimeter 1503. For example, as shown in FIGS. 1 & 2, a significant portion of first wall 1601 is not located at the perimeter 1503, but is located on surface 1501 at a location that is towards the center of surface 1501 (e.g., "in" or "recessed" from perimeter 1503). This "recessed" position of first wall 1601 (and thus air impeding structure 1600) allows for decreased damage to an underlying processing unit socket during installation of socket cover 1000. This is because surface 1501 may have more flex at locations closer to the perimeter 1503 than at locations that are "recessed" from perimeter 1503. Thus, recessing the air impeding structure 1600 away from the perimeter 1503 may allow a force application at portion of surface 1501 that has less flex, thus having less likelihood of bending base 1500 such that base 1500 will hit or damage the pins of the processing unit socket. This, combined with the operative connection of air impeding structure with the engagement latches 1700, as will be described in further detail below, allows for decreased chance of damage to the underlying pins of the processing unit socket.

This location of air impeding structure may divide surface 1501 into different portions. In some examples, and as shown in FIGS. 1 and 2, air impeding structure 1600 may divide surface 1501 into equal portions. In these examples, air impeding structure 1600 may run directly over a center portion of surface 1501. In other examples, air impeding structure 1600 may divide surface 1501 into unequal portions. For example, air impeding structure 1600 may divide surface 1501 into a first portion that is roughly ⅓ of the entire surface area of surface 1501 and a second portion that is roughly ⅔ of the entire surface area of surface 1501.

As discussed above, socket cover 1000 may include engagement latch 1700 that is connected to air impeding structure 1600. As used herein "connected" may include examples where engagement latch 1700 is directly connected to a portion of air impeding structure (e.g., in FIGS. 1 and 2, where first wall 1601 is directed connected to engagement latch 1700) and examples where engagement latch 1700 is indirectly connected to a portion of air impeding structure (e.g., in FIGS. 21 and 22). The connection of engagement latch 1700 to air impeding structure 1600 allows engagement latch 1700 to be operative upon a force application at air impeding structure 1600. In other words, engagement latch 1700 may be characterized as being operatively connected to air impeding structure. As used herein, "operatively connected" may mean that a first component may perform a function through the operation of a second component that the first component is connected to.

In some examples, engagement latch 1700 may comprise a snap-on lock. As used herein, a "snap-on" mechanism may include a lock with a flexible part. In the resting position, for example, when no force is applied on the flexible part, the flexible part may form part of an opening meant to engage with a corresponding portion of a processing unit socket. The opening is too small to attach to the corresponding portion of the socket, which may comprise a portion that is bigger than the opening. When a force is applied on the flexible part, the flexible part moves, allowing the opening to expand for an insertion of the corresponding portion of the socket and thus accommodating the bigger portion of the corresponding portion of the socket. Once the bigger portion of the corresponding portion of the socket is accommodated, the flexible part moves back to its resting position, snapping into place to engage the remainder of the corresponding portion of the socket. In some examples, a user feedback may be sensed as a tactile indication that the socket cover is installed (e.g., a "snap" may be heard). In some examples, the snap-on lock may comprise an annular snap-in lock 1701, as shown in FIGS. 1 & 2. Annular snap-in lock may include flexible piece 1701A that may snap into place when annular snap-in lock is placed over a corresponding portion of a socket. While FIGS. 1 & 2 show socket cover 1000 as having two engagement latches 1700, socket cover 1000 is not limited to the number of engagement latches shown. For example, socket cover 1000 may have more or less than two engagement latches 1700 (e.g., one engagement latch, three engagement latch, four engagement latches, etc.)

Base 1500 also has a surface 1502 that faces the socket when socket cover 1000 is installed on the socket. Thus, surface 1501 may be characterized as a "first" surface and surface 1502 may be characterized as a "second" surface. In some examples, socket cover 1000 may include dust wall 1504. Dust wall 1504 may protrude from second surface 1502. Accordingly, dust wall 1504 may shield socket from dust collection.

Figure 3:
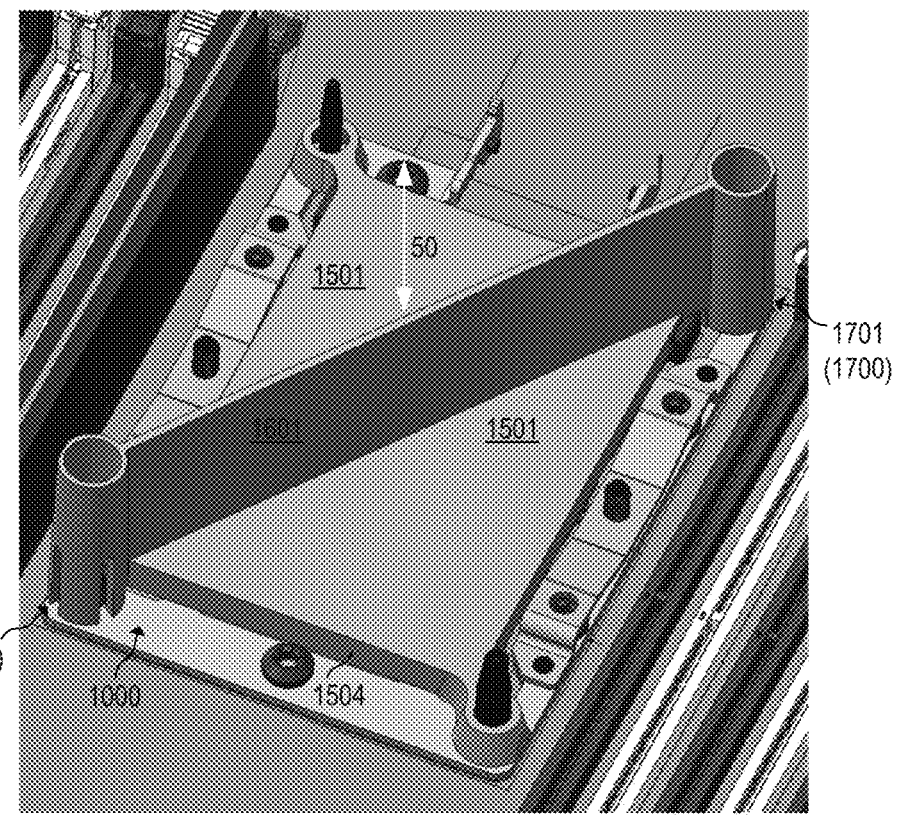
FIG. 3 illustrates the socket cover of FIG. 1 installed on a socket, according to some examples.

FIG. 3 illustrates socket cover 1000 installed on an underlying processing unit socket. As discussed above, socket cover 1000 may be installed by applying a downward force 50 on first wall 1601 of air impeding structure 1600. In some examples, and as shown in FIG. 3, the downward force 50 may be applied in the middle of first wall 1601. Because first wall 1601 (and thus air impeding structure 1600) is connected to annular snap-on locks 1701, the downward force 50 is transferred through air impeding structure 1600 to annular snap-on locks 1701 to attach socket cover 1000 to the underlying processing unit socket. To remove socket cover 1000 from the underlying processing unit socket, an upward force 50 may be applied on first wall 1601 (e.g., by a user pulling on first wall 1601). The upward force 50 may be transferred through air impeding structure 1600 to annular snap-on locks 1701 such that snap-on locks 1701 disengage from the underlying processing unit socket. Accordingly, socket cover 1000 provides a protective cover and a baffle that may be installed and removed from the underlying processing unit socket without directly interacting with the base 1500. Additionally, the point of interaction (i.e. user force application) is moved further away from the edge of the base. These features allow for less chance of damage to the underlying processing unit socket. Socket cover 1000 of FIGS. 1, 2, and 3 may have some or all of structure aspects of socket cover 2000, socket cover 3000, socket cover 4000, socket cover 5000, socket cover 6000, socket cover 8000, or socket cover 9000.

Figure 4:
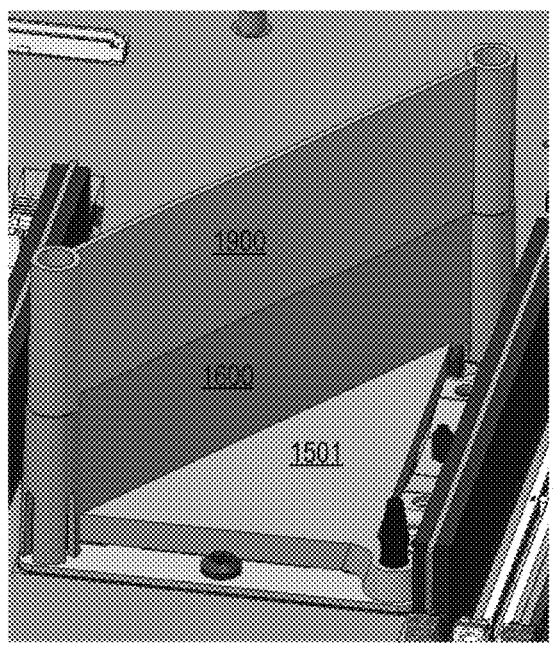
FIG. 4 illustrates the socket cover of FIG. 1 with a second air impeding structure, according to some examples.

FIG. 4 illustrates socket cover 1000 with a second air impeding structure 1900 attached to air impeding structure 1600. Second air impeding structure 1900 may be similar to air impeding structure 1600 and may attach to the top of air impeding structure 1600 through latches and/or snap-on features present on the second air impeding structure. Second air impeding structure 1900 may be added to socket cover 1000 for additional air impedance of the computing device over the underlying processing unit socket.

FIGS. 5 & 6 illustrate a socket cover 2000. Socket cover 2000 is similar to socket cover 1000, except that socket cover 2000 has an air impeding structure 2600 that extends across surface 2501 diagonally and vertically. Air impeding structure 2600 may comprise a first wall 2601 that extends across surface 2501 diagonally. Air impeding structure 2600 may also comprise a second wall 2602 and a third wall 2603 that intersect first wall 2601. Second wall 2602 may extend vertically from one side of perimeter 2503 to intersect first wall 2601 and third wall 2603 may extend vertically from another side of perimeter 2503 to intersect first wall 2601. As shown in FIGS. 5 & 6, second wall 2602 and third wall 2603 may extend past perimeter 2503. Socket cover 2000 may be installed and removed from a processing unit socket in the same manner as described above in relation to socket cover 1000. However, as compared with socket cover 1000, socket cover 2000 may provide air impedance that is not directional due to the presence of second wall 2602 and third wall 2603. This is because second wall 2602 and third wall 2603 provides a break in the surface of first wall 2601. Socket cover 2000 of FIGS. 5 & 6 may have some or all of structure aspects of socket cover 1000, socket cover 3000, socket cover 4000, socket cover 5000, socket cover 6000, socket cover 8000, or socket cover 9000.

Figure 7:
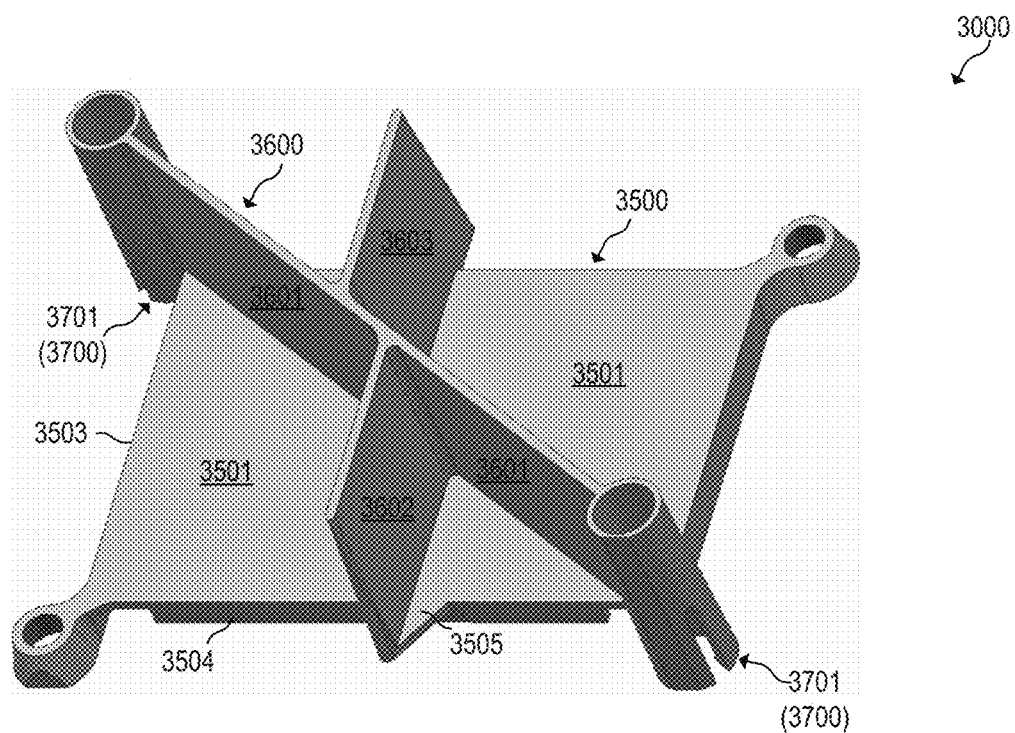
FIG. 7 illustrates a top perspective view of a socket cover with an air impeding structure, according to some examples.
Figure 8:
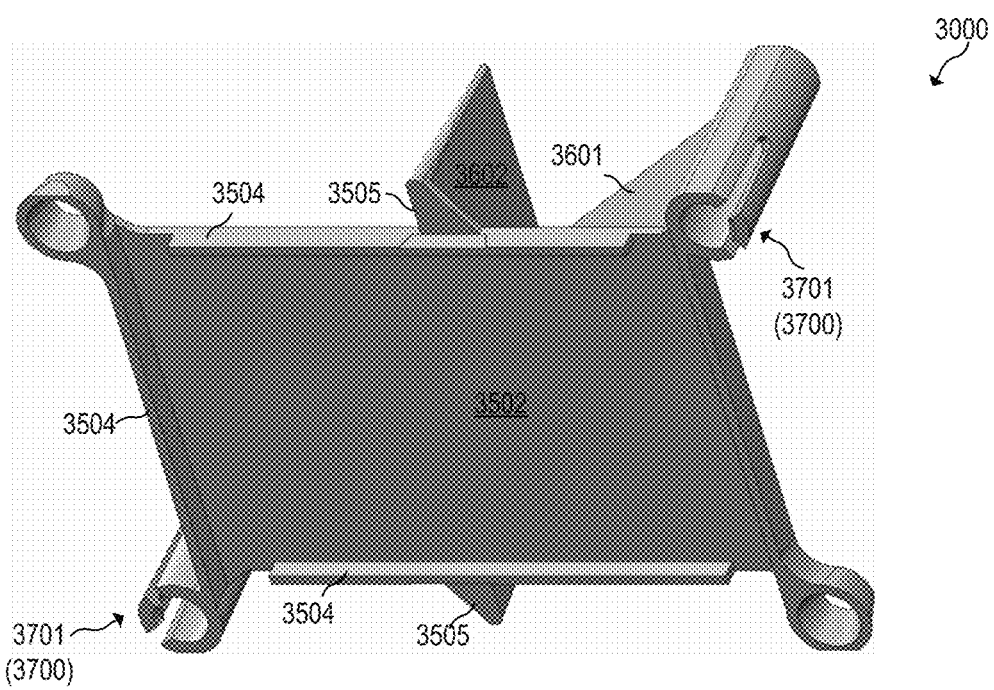
FIG. 8 illustrates a bottom perspective view of the socket cover of FIG. 7, according to some examples.

FIGS. 7 & 8 illustrate a socket cover 3000. Socket cover 3000 is similar to socket cover 2000, except that surface 3501 of socket cover 3000 has triangular portions 3505 that the portions of second wall 3602 and the third wall 2603 that extend past perimeter 3503 are connected to. Thus, unlike with socket cover 2000, second wall 3602 does not extend past perimeter 3503 and third wall 3603 does not extend past perimeter 3503. Rather, perimeter 3503 encompasses triangular portions 3505. As compared to socket cover 2000, socket cover 3000 may provide more structural integrity due to triangular portions 3505.

Figure 9:
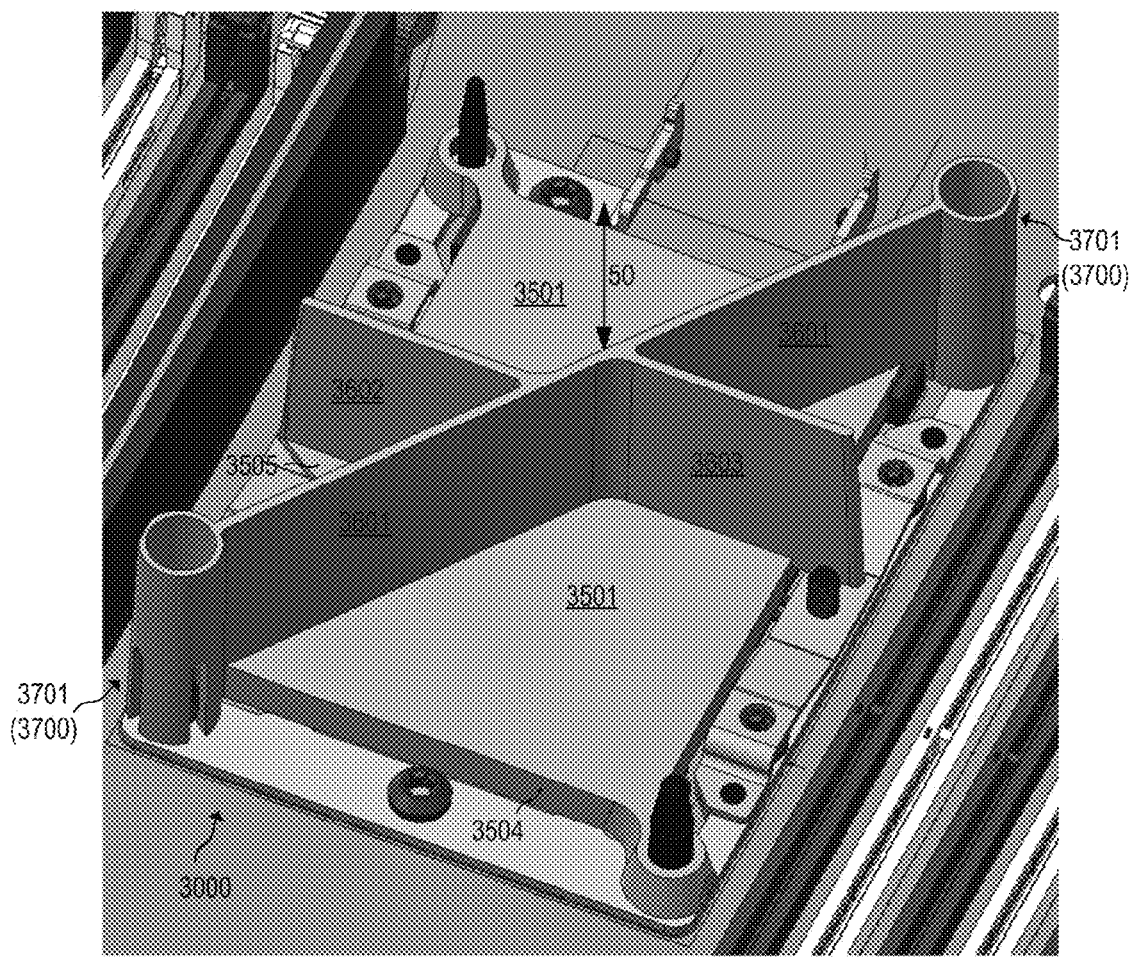
FIG. 9 illustrates the socket cover of FIG. 7 installed on a socket, according to some examples.

FIG. 9 illustrates socket cover 3000 installed on an underlying processing unit socket. Similar to socket cover 1000 and socket cover 2000, socket cover 3000 may be installed by applying a downward force 50 on air impeding structure 3600. In some examples, and as shown in FIG. 9, the downward force 50 may be applied in the middle of first wall 3601. Because first wall 3601 (and thus air impeding structure 3600) is connected to annular snap-on locks 3701, the downward force 50 is transferred through air impeding structure 3600 to annular snap-on locks 3701 to attach socket cover 3000 to the underlying processing unit socket. To remove socket cover 1000 from the underlying processing unit socket, an upward force 50 may be applied on first wall 3601 (e.g., by a user pulling on first wall 3601). The upward force 50 may be transferred through air impeding structure 3600 to annular snap-on locks 3701 such that snap-on locks 3701 disengage from the underlying processing unit socket. Accordingly, socket cover 3000 provides a protective cover and a baffle for the underlying processing unit socket that may be installed and removed from the processing unit socket without directly interacting with the base 3500. Additionally, the point of interaction (i.e. user force application) is moved further away from the edge of the base. These features allow for less chance of damage to the underlying processing unit socket. Socket cover 3000 of FIGS. 7, 8, and 9 may have some or all of structure aspects of socket cover 1000, socket cover 2000, socket cover 4000, socket cover 5000, socket cover 6000, socket cover 8000, or socket cover 9000.

Figure 10:
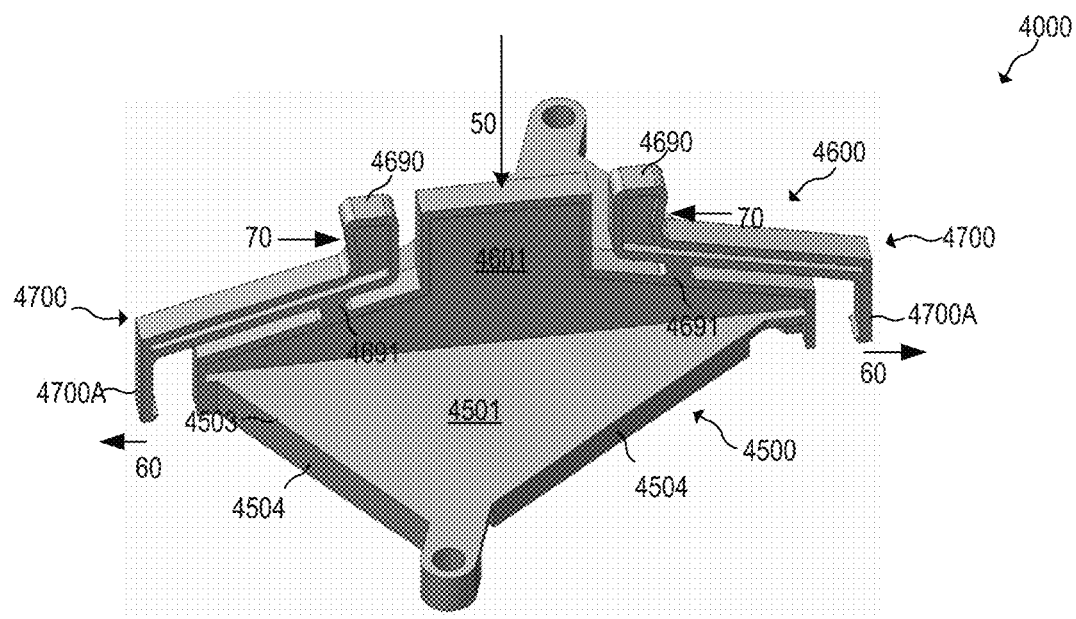
FIG. 10 illustrates a top perspective view of a socket cover with an air impeding structure, according to some examples.
Figure 11:
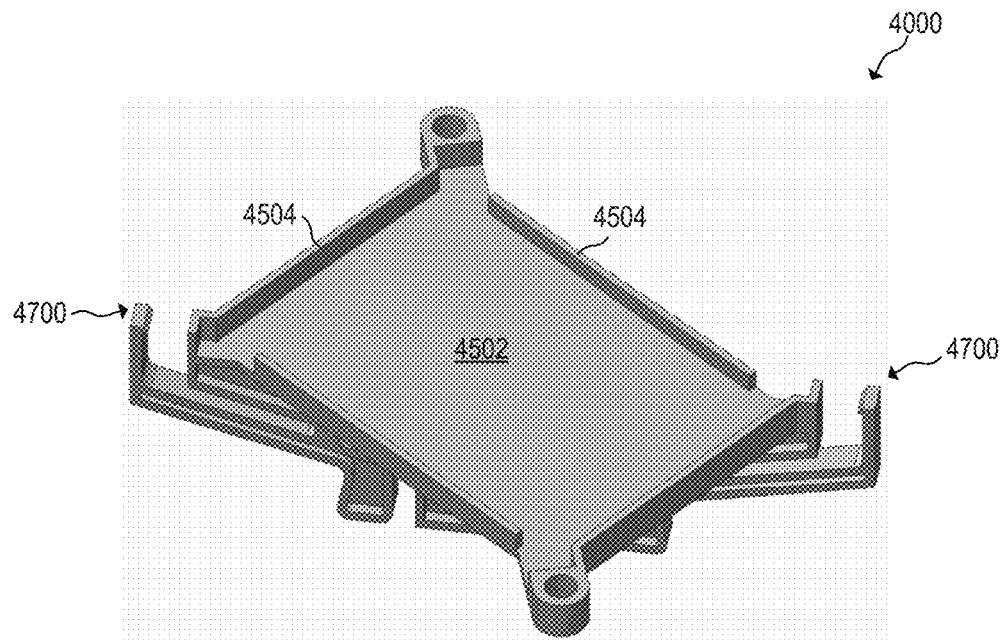
FIG. 11 illustrates a bottom perspective view of the socket cover of FIG. 10, according to some examples.

FIGS. 10 and 11 illustrates a socket cover 4000. Socket cover 4000, like socket covers 1000, 2000, and 3000, has a base 4500 with a surface 4501 and an air impeding structure 4600 protruding from surface 4501. Base 4500 has a perimeter 4503 that is an outer boundary of base 4500. Air impeding structure comprises a wall 4601 that extends from a first side of perimeter 4503 to a second side of perimeter 4503 and bisects surface 4501. Socket cover 4000, like socket covers 1000, 2000, and 3000, may also have dust walls 4504 that protrude from a second surface 4502 of base 4500.

Socket cover 4000 comprises engagement latches 4700. Engagement latches 4700 are different from annular snap-on locks 1701, 2701, 3701. However, engagement latches 4700 may also act as a snap-on lock. For example, engagement latches may have flexible arm 4700A that is connected to air impeding structure 4600. Upon a downward force application 50 at wall 4601 of air impeding structure 4600, arm 4700A may move in direction 60 to allow engagement latch 4700 to engage with a corresponding portion of an underlying processing unit socket. Once engagement latch 4700 engages with a corresponding portion of the underlying processing unit socket, a "snap" may be heard to indicate the engagement.

Air impeding structure 4600 may also comprise squeezable handles 4690. Squeezable handles 4690 may be operatively connected to engagement latches 4700. For example, a movement of squeezable handles 4690 in the direction of 70 may move flexible arms 4700A of engagement latches 4700 in the direction 60. This allows for engagement latches to be installed on and removed from an underlying processing unit socket.

Accordingly, one way socket cover 4000 may be installed on the underlying processing unit socket is by applying a force 70 on squeezable handles 4690. Because squeezable handles 4690 (and thus air impeding structure 4600) are operatively connected to engagement latches 4700, force 70 transfers to movement 60 by flexible arms 4700A of engagement latches 4700, allowing engagement latches 4700 to engage with a corresponding portion of an underlying processing unit socket and for socket cover 4000 to be installed on the processing unit socket. In some examples, and as shown in FIG. 10, squeezable handles 4690 may be connected to engagement latches 4700 through hinges 4691.

Another way socket cover 4000 may be installed is by applying a downward force 50 on first wall 4601 of air impeding structure 4600. In some examples, and as shown in FIG. 10, the downward force 50 may be applied in the middle of wall 4601. This downward force 50 may force flexible arms 4700A in the direction 60 because air impeding structure 4600 is operatively connected to engagement latches 4700. This allows the socket cover 4000 to attach to the underlying processing unit socket. To remove socket cover 4000 from the underlying processing unit socket, a force 70 may be applied to squeezable handles 4690. Because squeezable handles 4690 (and thus air impeding structure 4600) are operatively connected to engagement latches 4700, force 70 transfers to a movement 60 by flexible arms 4700A of engagement latches 4700, allowing engagement latches 4700 to disengage with a corresponding portion of an underlying processing unit socket and for socket cover 4000 to be removed from the processing unit socket. Accordingly, socket cover 4000 provides a cover and a baffle for the underlying processing unit socket that may be installed and removed from the socket without directly interacting with the base 4500. Additionally, the point of interaction (i.e. user force application) is moved further away from the edge of the base. These features allow for less chance of damage to the underlying processing unit socket. Socket cover 4000 of FIGS. 10 & 11 may have some or all of structure aspects of socket cover 1000, socket cover 2000, socket cover 3000, socket cover 5000, socket cover 6000, socket cover 8000, or socket cover 9000.

Figure 12:
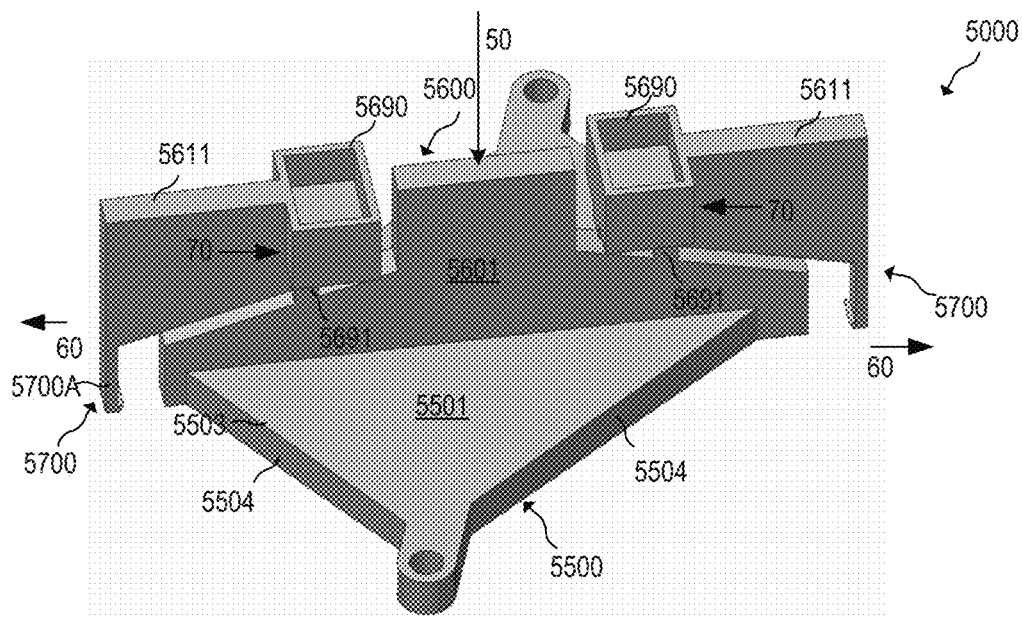
FIG. 12 illustrates a top perspective view of a socket cover with an air impeding structure according to some examples.
Figure 13:
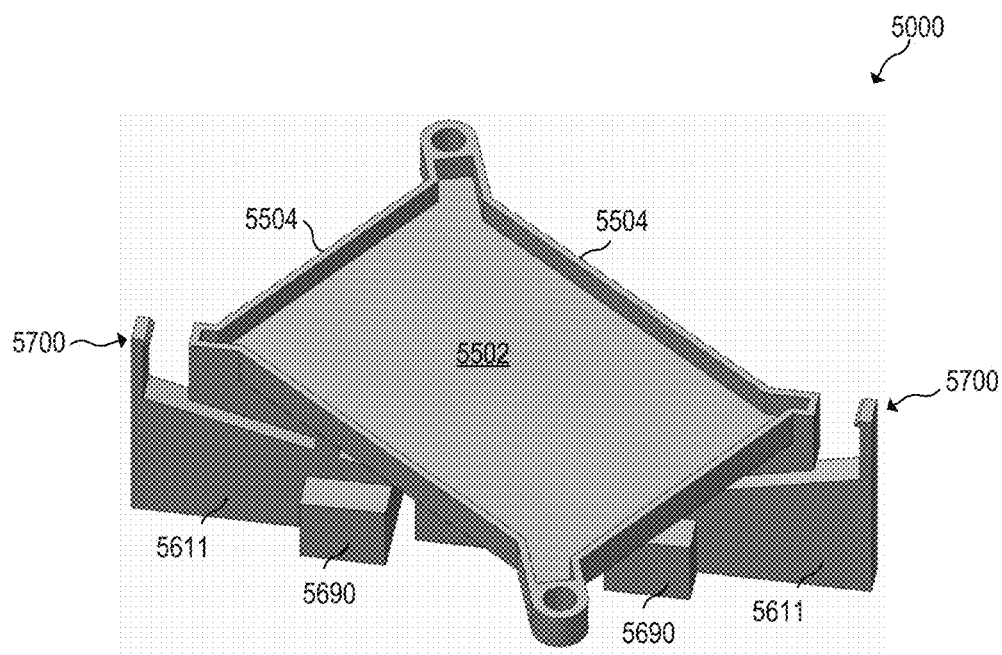
FIG. 13 illustrates a bottom perspective view of the socket cover of FIG. 12, according to some examples.

FIGS. 12 and 13 illustrates a socket cover 5000. Socket cover 5000 is similar to socket cover 4000, except that air impeding structure comprises additional air impeding features 5611 connected to squeezable handles 5690 that are not present in socket cover 4000. In some examples, additional air impeding features 5611 may be in the form of additional walls that are connected to squeezable handles 5690. Walls 5611 may allow air impeding structure 5600 to have an overall rectangular planar shape that is similar to the shape of first wall 1601 in socket cover 1000. As compared to socket cover 4000, socket cover 5000 may have increased air impedance. Socket cover 5000 is installed on an underlying processing unit socket and removed from the underlying processing unit socket in the same manner as socket cover 4000. Socket cover 5000 of FIGS. 12 & 13 may have some or all of structure aspects of socket cover 1000, socket cover 2000, socket cover 3000, socket cover 4000, socket cover 6000, socket cover 8000, or socket cover 9000.

FIGS. 14, 15, and 16 illustrate a socket cover 6000. Socket cover 6000 comprises a base 6500 and an air impeding structure 6600. As will be described below, base 6500 and air impeding structure 6600 may be attachable to each other through the interlocking of knobs 6800 and corresponding hole 6680. As used herein, "attachable" may mean two separate pieces that are physically joined together to form one piece. Thus, socket cover 6000 may begin with two separate pieces, base 6500 and air impeding structure 6600, that are physically joined together to form the socket cover 6000.

FIG. 14 shows socket cover 6000 before base 6500 and air impeding structure 6600 are attached. Base 6500 has a surface 6501 that faces away from an underlying socket and a perimeter 6503 that is defined by surface 6501. Base 6500 may also have two knobs 6800 that protrude from surface 6501. Air impeding structure 6600 may be comprised of a wall 6601 and may also have engagement latches 6700. Air impeding structure 6600 also has a hole 6680 formed in wall 6601. In some examples, hole 6680 is shaped and sized to accommodate knobs 6800. Accordingly, base 6500 is attachable to air impeding structure 6600 through the insertion of knobs 6800 into hole 6680. After insertion of knobs 6800 into hole 6680, knobs 6800 and hole 6680 may interlock in a manner that allows rotational movement of air impeding structure 6600 in relation to base 6500 but not up-and-down movement of air impeding structure 6600 in relation to base 6500.

FIGS. 15 & 16 show socket cover 6000 when base 6500 and air impeding structure 6600 are attached. As shown in FIG. 15, when attached, air impeding structure 6600 may extend across surface 6501 from one side of perimeter 6503 to another side of perimeter 6503. Additionally, air impeding structure 6600 may divide surface 6501, as discussed in regard to socket cover 1000. Additionally, when attached to base 6500, engagement latches 6700 are level with a surface 6502 that faces the socket, and not level with surface 6501.

Engagement latches 6700 may be hook-shaped such that they may snap on to a corresponding portion of an underlying processing unit socket. For example a portion of the hook-shape may be formed of flexible plastic that may move upon a force application to expand the opening created by the hook. Thus, engagement latches 6700 may also be characterized as an annular snap-on lock. Socket cover 6000 may be installed on an underlying processing unit socket by first placing socket cover 6000 over the processing unit socket and then applying a rotational force 55 to air impeding structure 6600. In some examples, and as shown in FIG. 15, the rotational force 55 may be applied in the middle of wall 6601. Because wall 6601 (and thus air impeding structure 6600) is rotatably attached to base 6500, rotational force 55 may move air impeding structure 6600 from a first position to a second position, allowing engagement latches 6700 to engage with corresponding portions of the underlying processing unit socket. To remove socket cover 6000 from the underlying processing unit socket, a rotational force 55 (in the opposite direction to the direction when installing the socket cover 6000) may be applied at wall 6601. The rotational force 55 may be transferred to engagement latches 6700 such that engagement latches 6700 disengage from the underlying socket. Accordingly, socket cover 6000 provides a cover and a blank for the underlying socket that may be installed and removed from the socket without directly applying force to base 6500. This allows for less chance of damage to the underlying socket. As seen in FIG. 16, in some examples, socket cover 6000 may not have dust walls like those seen in socket cover 1000. In other examples, and not shown, socket cover 6000 may have dust walls that protrude from surface 6502. Socket cover 6000 of FIGS. 14, 15, and 16 may have some or all of structure aspects of socket cover 1000, socket cover 2000, socket cover 3000, socket cover 4000, socket cover 5000, socket cover 8000, or socket cover 9000.

Figure 17:
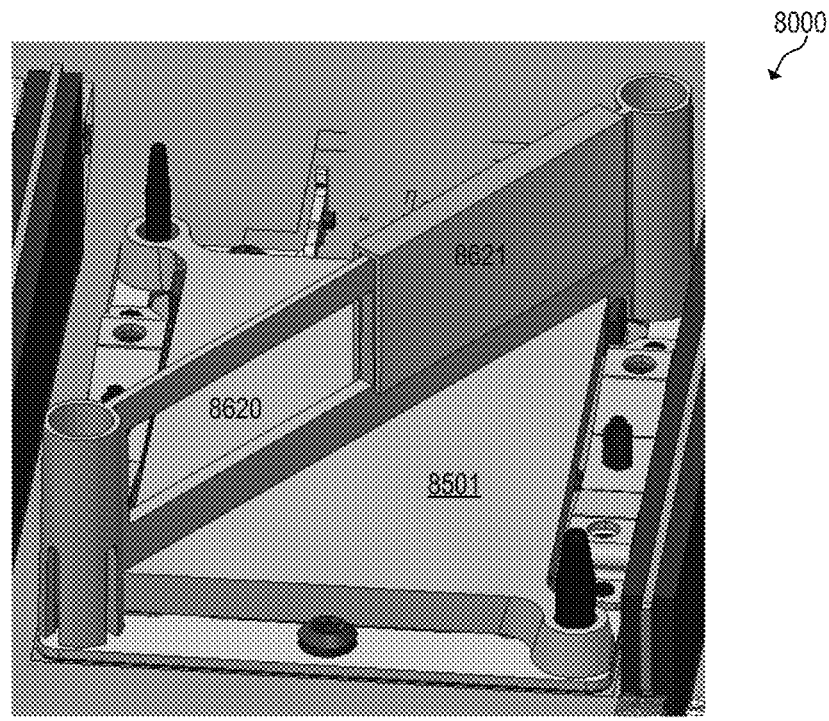
FIG. 17 illustrates a socket cover with an air impeding structure having a perforation, according to some examples.
Figure 18:
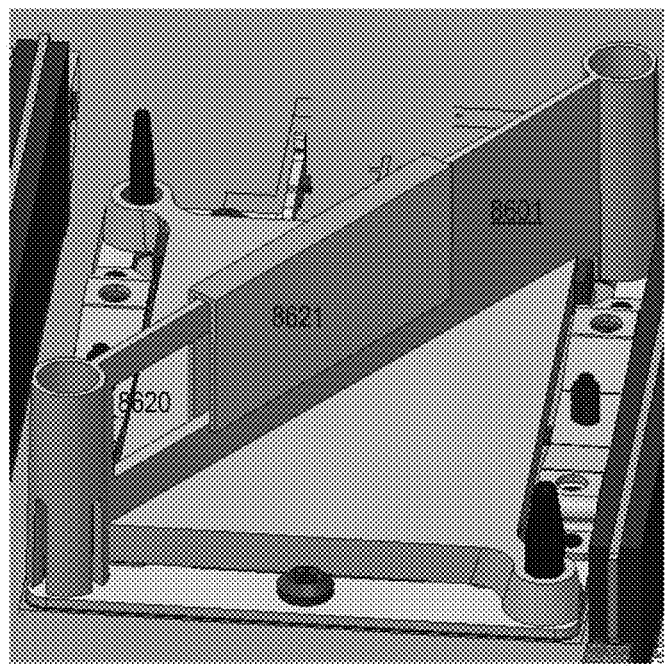
FIG. 18 illustrates the socket cover of FIG. 17 with the perforation partially covered, according to some examples.

FIGS. 17 & 18 illustrate a socket cover 8000. Socket cover 8000 is similar to socket cover 1000, except that air impeding structure of socket cover 8000 comprises an air flow perforation 8620 and a cover 8621 that is adjustably moveable over air flow perforation 8620. Accordingly, using air flow perforation 8620 and cover 8621, a user may control the air impedance that is provided by socket cover 8000. For example, cover 8621 may be moved into the position shown in FIG. 17 for less air impedance. As another example, cover 8621 may be moved into the position shown in FIG. 18 for increased air impedance. Socket cover 8000 of FIGS. 17 & 18 may have some or all of structure aspects of socket cover 1000, socket cover 2000, socket cover 3000, socket cover 4000, socket cover 5000, socket cover 6000, or socket cover 9000.

FIGS. 19-20 illustrate a socket cover 9000. Socket cover 9000 comprises a base 9500, an air impeding structure 9600, and an engagement latch 9700. In some examples, base 9500 has a surface 9501 that faces away from a socket when socket cover 9000 is installed on an underlying processing unit socket. Surface 9501 may define a perimeter 9503. In some examples, base 9500 may have a generally rectangular shape. Accordingly, perimeter 9503 may also have a generally rectangular shape. However, base 9500 and perimeter 9503 may take on other shapes.

Air impeding structure 9600 protrudes from surface 9501. In some examples, and as described above in relation to socket cover 1000, air impeding structure 9600 is connected to base 9500 in a manner that it cannot be detached from base 9500 without breaking or fragmenting the socket cover 9000. For example, base 9500 and air impeding structure 9600 may be integrally molded to form one piece of continuous material. In other examples, base and air impeding structure may be attachable to each other.

In some examples, air impeding structure 9600 comprises a circumferential wall 9604. In some examples, and as shown in FIG. 19, circumferential wall 9604 may form a generally oval shape. However, circumferential wall 9604 may form other shapes, including circular, rectangular, square, etc. Circumferential wall 9604 may extend across surface 9501 horizontally, vertically, or diagonally. For example, and as shown in FIGS. 19-20, circumferential wall 9604 (and thus air impeding structure 9600) extends across surface 9501 horizontally. In some examples, and as shown in FIGS. 19 & 20, air impeding structure 9600 extends across surface 9501 from one side of perimeter 9503 to another side of perimeter 9503. This allows air impeding structure 9600 to impede air currents that may flow over cover 9000 by providing a continuous blockage to air flow that may flow over surface 9501.

Additionally, as discussed above in relation to socket cover 1000, a portion of air impeding structure 9600 may be located a distance away from perimeter 9503. For example, as shown in FIGS. 19 & 20, a significant portion of circumferential wall 9604 is not located at the perimeter 9503, but is located on surface 9501 at a location that is towards the center of surface 9501 (and "in" or "recessed" from perimeter 9503). For the same reasons as discussed above in relation to FIG. 1, this "recessed" position of circumferential wall 9604 (and thus air impeding structure) on surface 9501 allows for decreased damage to an underlying socket during installation of socket cover 9000.

This location of air impeding structure may divide surface 9501 into different portions. In some examples, and as shown in FIGS. 19 and 20, air impeding structure 9600 may divide surface 9501 into equal portions. In these examples, air impeding structure 9600 may run directly over a center portion of 9501. In other examples, air impeding structure 9600 may divide surface 9501 into unequal portions.

In some examples, circumferential wall is continuous to encompass an interior space 9605. Air impeding structure 9600 may also include a first connecting wall 9606 and a second connecting wall 9607 that extends across the interior space 9605. First connecting wall 9606 may connect one side of circumferential wall 9604 to another side of circumferential wall 9604. Similarly, second connecting wall 9607 may also connect one side of circumferential wall 9604 to another side of circumferential wall 9604. In some examples, and as shown in FIG. 19, first connecting wall 9606 and second connecting wall 9607 connect the same two sides of circumferential wall together and thus may run generally parallel to each other.

Accordingly, first connecting wall 9606 and second connecting wall 9607 may divide interior space 9605 into separate compartmentalized sections. For example, and as shown in FIG. 19, first connecting wall 9606 and second connecting wall 9607 may divide interior space 9605 into a first compartmentalized section 9605B, a second compartmentalized section 9605C, and a middle compartmentalized section 9605A between first compartmentalized section 9605B and second compartmentalized section 9605C. While socket cover 9000 is shown as having two connecting walls and three compartmentalized sections, socket cover 9000 is not limited to the number of connecting walls and compartmentalized sections shown.

In some examples, and as shown in FIG. 19, circumferential wall 9604 is recessed from perimeter 9503 by an amount that allows middle compartmentalized section 9605A to lay over the center of base 9500. The location of the middle compartmentalized section 9605A being at the center of base 9500 may decrease the amount of pin damage to the underlying socket.

As discussed above in relation to socket cover 1000, socket cover 9000 may include engagement latch 9700 that is connected to air impeding structure 9600. In some examples, and as shown in FIG. 19, engagement latch 9700 is connected to air impeding structure 9600 through sloped wall 9610. Sloped wall 9610 may begin at circumferential wall 9604 with a height that is similar to a height of circumferential wall 9604. As sloped wall continues to engagement latch 9700, the height of sloped wall 9610 may taper to a lower height. Sloped wall 9610 allows for a force that is applied on air impeding structure (and specifically circumferential wall 9604) to be transferred to engagement latch 9700. Thus, as discussed above in relation to socket cover 1000, engagement latch 9700 may be operatively connected to air impeding structure 9600.

In some examples, engagement latch 9700 may comprise a snap-on lock, as discussed above. In some examples, the snap-on lock may comprise an annular snap-in lock 9701, as shown in FIGS. 19 & 20. While FIGS. 19 & 20 show socket cover 9000 as having four engagement latches 9700, socket cover 9000 is not limited to the number of engagement latches shown. For example, socket cover 9000 may have more or less than four engagement latches 9700 (e.g., one engagement latch, two engagement latches, three engagement latches, etc.)

Base 9500 also has a surface 9502 that faces the socket when socket cover 9000 is installed on the processing unit socket. In some examples, socket cover 9000 may include dust wall 9504. Dust wall 9504 may protrude from surface 9502. Accordingly, dust wall 9504 may shield socket from dust collection.

FIG. 21 illustrates socket cover 9000 installed on an underlying processing unit socket. As discussed above, socket cover 9000 may be installed by applying a downward force 50 on circumferential wall 9604. In some examples, and as shown in FIG. 21, the downward force 50 may be applied on middle compartmentalized section 9605A. Because circumferential wall 9604 (and thus air impeding structure 9600) is connected to engagement latches 9700 through sloped wall 9610, the downward force 50 is transferred through air impeding structure 9600 to engagement latches 9700 to attach socket cover 9000 to the underlying processing unit socket. To remove socket cover 9000 from the underlying processing unit socket, an upward force 50 may be applied on circumferential wall 9604 (e.g., by a user pulling on circumferential wall 9604). The upward force 50 may be transferred through air impeding structure 9600 to engagement latches 9700 such that engagement latches 9700 disengages from the underlying processing unit socket. Accordingly, socket cover 9000 provides a cover and a baffle for the underlying socket that may be installed and removed from the socket without directly applying a force on base 9500. Additionally, the force application is at the middle section 9605A and thus removed from the edge of the base 9500. These features allows for less chance of damage to the underlying processing unit socket. Socket cover 9000 of FIGS. 19, 20, and 21 may have some or all of structure aspects of socket cover 1000, socket cover 2000, socket cover 3000, socket cover 4000, socket cover 5000, socket cover 6000, or socket cover 8000.

Figure 22:
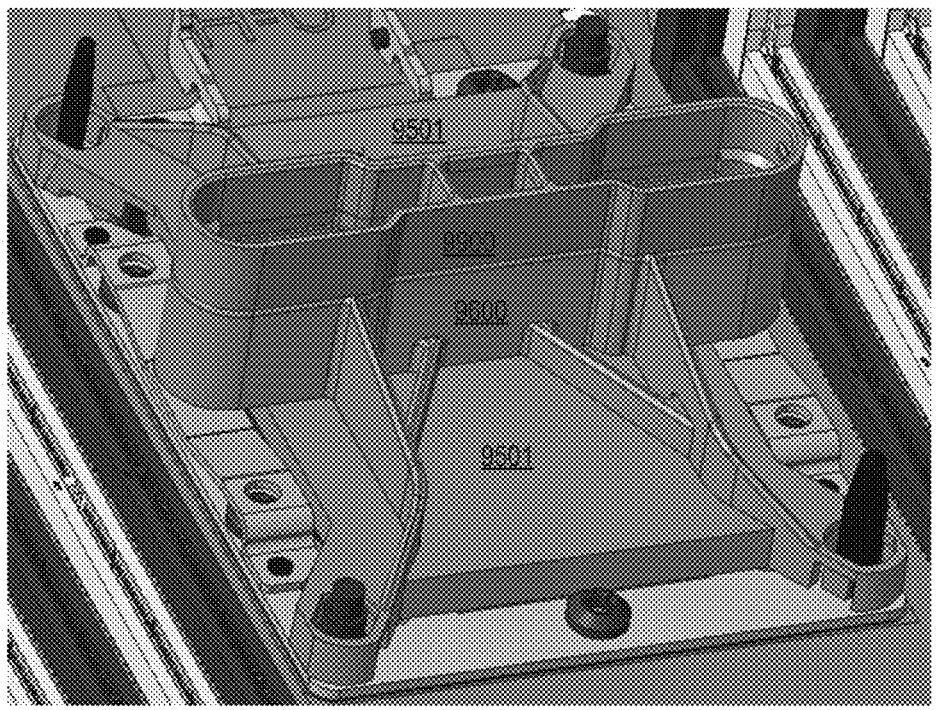
FIG. 22 illustrates the socket cover of FIG. 20 with a second air impeding structure, according to some examples.

FIG. 22 illustrates socket cover 9000 with a second air impeding structure 9900 attached to air impeding structure 9600. Second air impeding structure 9900 may have a circumferential wall that is similar to circumferential wall 9604, and connecting walls that are similar to connecting walls 9606 and 9607. Second air impeding structure 9900 and may attach to the top of air impeding structure 9600 through latches and/or snap-on features. Second air impeding structure 9900 may be added to socket cover 9000 for additional air impedance.

Socket covers 1000-9000 may be comprised of durable and flexible materials, including but not limited to different types of metals, thermoplastic polymers, such as polycarbonate and polycarbonate alloys (e.g., PC-ABS, Lexan, etc.), etc.

All of the features disclosed in this specification (including any accompanying claims, abstract and drawings), and/or all of the elements of any method or process so disclosed, may be combined in any combination, except combinations where at least some of such features and/or elements are mutually exclusive.

What is claimed is:

1. A processing unit socket cover comprising:
  a base with a surface facing away from a socket, and a perimeter defined by the surface;
  an air impeding structure protruding from the surface;
    wherein the air impeding structure extends from a first side of the perimeter to a second side of the perimeter and divides the surface;
    wherein the air impeding structure comprises a first wall that diagonally bisects the surface; and
  an engagement latch connected to the air impeding structure to attach to the socket.

2. The processing unit socket cover of claim 1, wherein the engagement latch attaches to the socket via a force applied on the air impeding structure.

3. The processing unit socket cover of claim 1, wherein the air impeding structure divides the surface into substantially equal portions.

4. The processing unit socket cover of claim 1, wherein the engagement latch comprises an annular snap-on lock.

5. A processing unit socket cover comprising:
  a rectangular base with a surface;
  an air impeding structure protruding from the surface;
    wherein the air impending structure extends across the surface;
    wherein the air impeding structure comprises a wall that diagonally bisects the surface; and
  an annular snap-on lock operatively connected to the air impeding structure to attach to a socket.

6. The processing unit socket cover of claim 5, wherein the annular snap-on lock attaches to the socket via a force applied on the air impeding structure.

7. The processing unit socket cover of claim 5, wherein the rectangular base comprises a boundary, and the air impending structure is located at a distance away from the boundary.

8. A processing unit socket cover comprising:
  a base with a surface and a perimeter defined by the surface;
  a first air impeding structure protruding from the surface, wherein the first air impeding structure extends from a first side of the perimeter to a second side of the perimeter and bisects the surface;
  a second air impeding structure attached to the first air impeding structure; and
  a plurality of connection points, wherein at least one connection point out of the plurality of connection point comprises a snap-on lock to attach to a socket.

9. The processing unit socket cover of claim 8, wherein the snap-on lock attaches to the socket via a force applied on the first air impeding structure.

\* \* \* \* \*